United States Patent [19]

Anthony et al.

[11] 4,170,496

[45] Oct. 9, 1979

[54] BEVELED WAFER FOR THERMAL GRADIENT ZONE MELTING UTILIZING A BEVELED WAFER EDGE

[75] Inventors: Thomas R. Anthony, Schenectady, N.Y.; Harvey E. Cline, Stanford, Calif.

[73] Assignee: General Electric Company, Schenectady, N.Y.

[21] Appl. No.: 967,284

[22] Filed: Dec. 7, 1978

[51] Int. Cl.² .............................................. H01L 21/225
[52] U.S. Cl. ........................................ 148/33; 148/1.5; 252/62.3 E; 252/62.3 GA; 357/55
[58] Field of Search ............... 148/1.5, 33, 177, 187; 252/62.3 E, 62.3 GA; 357/55

[56] References Cited

U.S. PATENT DOCUMENTS

| 3,179,860 | 4/1965 | Clark et al. ............... 357/55 X |
| 3,255,055 | 6/1966 | Ross ........................... 148/33 X |
| 3,697,829 | 10/1972 | Huth et al. ....................... 357/55 |
| 3,895,967 | 7/1975 | Anthony et al. ........... 148/187 X |
| 4,001,047 | 1/1977 | Boah ............................ 148/1.5 |
| 4,035,199 | 7/1977 | Anthony et al. ............... 148/1.5 |
| 4,075,038 | 2/1978 | Anthony et al. ............... 148/1.5 |

Primary Examiner—G. Ozaki
Attorney, Agent, or Firm—Donald M. Winegar; Joseph T. Cohen; Leo I. MaLossi

[57] ABSTRACT

A body of semiconductor material to be processed by thermal gradient zone melting (TGZM) has an outer side peripheral surface beveled at a predetermined included angle α with the bottom surface of the body in order that the radiant heat impinging on the beveled side peripheral surface is equal to the radiant heat emitted by the beveled side peripheral surface of the body.

3 Claims, 5 Drawing Figures

BEVELED WAFER FOR THERMAL GRADIENT ZONE MELTING UTILIZING A BEVELED WAFER EDGE

BACKGROUND OF THE INVENTION

1. Field of the Invention

This invention relates to beveling an outer perpendicular surface of a wafer, or body, of semiconductor material to improve the processing of the body of semiconductor material by thermal gradient zone melting (TGZM) when a radiant heat source is used to heat and develop a thermal gradient in the body being processed.

2. Description of the Prior Art

In the manufacture of semiconductor devices, it is normally necessary to alter the conductivity type of one or more selected regions of a semiconductor body by doping these regions with conductivity-modifying impurity atoms. Today, such doping is usually accomplished commercially by solid state diffusion, ion implantation, liquid epitaxial growth, or vapor epitaxial growth. Such factors, as costs, speed, junction characteristics, and the particular type of semiconductor material being used, determine which method is most practical.

A little used and less widely known technique for doping semiconductor material is thermal gradient zone melting. This technique can produce very abrupt junctions with unusual configurations and high dopant concentrations in a body of semiconductor material in a relatively short period of time. Early descriptions of such thermal migration and some of its applications are found in U.S. Pat. No. 2,813,048, issued to W. G. Pfann and in his book "Zone Melting," copyright by John Wiley and Sons, Inc. (1958). While the basic principle of thermal migration was known very early in the life of the semiconductor industry, a number of unsolved problems prevented its use as a standard processing technique by the semiconductor industry.

Thermal gradient zone melting (TGZM) is a process in which a small amount of dopant is disposed on a selected surface of a body of semiconductor material and the processed body is then exposed to a temperature gradient at an elevated temperature. The overall temperature at which the process is carried out must be sufficiently high in order to form a melt of metal-rich semiconductor material containing the dopant material. Under these conditions, the melt will migrate through a solid body of material along and up the lines of heat flow (a thermal gradient) from low temperatures to high temperatures, leaving in its path a recrystallized region of semiconductor material containing the solid solubility limit of the metal therein which includes the dopant material. The temperature gradient must be uniform and unidirectional if the pattern of dopant material disposed on the surface area which is on the entrance face of the wafer is to be faithfully reproduced as a recrystallized dopant zone or region in the semiconductor wafer.

One of the most difficult problems which appears to be preventing the widespread use of thermal gradient zone melting has been the inability for one to be able to generate a large uniform thermal gradient across the thickness of a thin fragile semiconductor wafer without fracturing the wafer or contaminating the wafer with undesirable impurities.

A number of means of applying a large uniform thermal gradient have been tried including a plasma torch, a gas torch, a solar mirror, a scanning electron beam, a heated anvil and infrared radiation. The most satisfactory method of those tried has been to expose one side of a semiconductor wafer to a widespread intense source of infrared radiation while at the same time exposing the opposing side of the wafer to a cold black body heat sink. For a complete description of the infrared radiation method, attention is directed to the teachings of John K. Boah, entitled "Temperature Gradient Zone Melting Utilizing Infrared Radiation," U.S. Pat. No. 4,001,047, and assigned to the same assignee as this application.

Although the infrared radiation method of Boah produces a uniform thermal gradient through most of a semiconductor wafer, it has been discovered that around the peripheral edge of a wafer the thermal gradients are severely distorted from their otherwise unidirectional direction, which is perpendicular to the two major opposed surfaces, in the rest of the wafer by the discontinuity associated with the peripheral edge of a wafer. On first examination, it would appear that this thermal gradient distortion should only extend inwardly the equivalent of several wafer thickness from the edge of a wafer.

With reference to FIG. 1, there is shown a wafer 110 of semiconductor material processed in the prior art by thermal gradient zone melting. The wafer 110 has opposed major surfaces 112 and 114. Migration of one or more melts of metal-rich semiconductor material is from surface 112 to surface 114 when the surface 114 is exposed to infrared radiation. The infrared radiation of Boah produces radiation 116 which is incident upon the surface 114 and travels through the wafer 110 and is reradiated from the surface 112 and edges 128 of the wafer 110 as flow lines 122. The loss of heat from the edge or edges 128 of the wafer 110 distorts the heat flow lines 120 from a course directly between and perpendicular to the major surfaces 112 and 114 to an angled course of travel. That is the heat flow lines 120 deviate from the normal to the surfaces 112 and 114, and are not parallel with each other. Such non-parallel heat flow 120 will distort, and in some instances, break up any liquid alloy melt zone migrating through the material regions of distorted heat flow in the wafer 110. Only the area, or volume of material, in the center of the wafer where the heat flow lines 120 are substantially parallel to each other and perpendicular to the major surfaces 112 and 114 of the wafer 110 is useful for commercial semiconductor processing. However, we have found experimentally that for a wafer 110 with a radius of 25.4 mm, and a thickness of 0.25 mm, that the distortion of the thermal gradient generated by a heat loss around the edges 128 of the wafer 110 extends inwardly toward the center a distance of about 3 mm from the edge 128 of the wafer 110. Thus, the area over which the thermal distortion occurs represents about twenty percent of the area and volume of the wafer 110. Semiconductor devices made within this area, or volume of material must be discarded in most cases, thereby reducing processing yields and increasing processing costs. Consequently, a strong commercial incentive exists to find a practical means of eliminating the thermal distortions in the area contiguous with the peripheral edge 128 of the semiconductor wafer 110.

In U.S. Pat. No. 4,035,199, we have previously disclosed a method by which such thermal distortion can be minimized around the edge of a semiconductor wafer by having an annular guard ring configuration of a layer of absorption enhancing material disposed on the outer peripheral portion of the semiconductor wafer facing the source of the infrared radiation, and by having a centrally oriented disk-like configuration of a layer of emission enhancing material on the opposing face of the wafer facing the heat sink. This configuration is engineered so that additional heat is delivered to the otherwise relatively cold outer peripheral areas of the wafer while additional heat is drained from the otherwise relatively hot central portion of the wafer. The additional injection and extraction heat from these critical wafer areas minimized the heat flow tendencies shown in FIG. 1 and thus enabled one to use a larger percentage of the wafer area for device production. This result, however, was not obtained without incurring any disadvantages for a number of process steps had to be added to the overall process both to form and to configure the emission enhancing and absorption enhancing layers, thereby directly increasing production costs. In addition, for certain devices, the formation and configuration of these optical layers is not feasible since the various thermal anneals, chemical etches and masking steps involved either degrading or destroying the devices that one is attempting to produce.

In U.S. Pat. No. 3,895,967, we have previously disclosed a method by which thermal gradient distortions can be minimized around the edge of a thick semiconductor ingot as opposed to a thin semiconductor wafer. This method employed a guard ring of semiconductor material of the same thickness as the semiconductor ingot disposed about, and spaced from, the peripheral edge of the semiconductor ingot. This guard ring ingot arrangement adjusted the thermal distortion problem radially outward into the guard ring which could be re-used over and over again and eliminated thermal gradient distortions in the semiconductor ingot that was being processed. One requirement of this method was that the space or gap between the guard ring and the semiconductor ingot has to be less than one-tenth of the thickness of the semiconductor ingot. Otherwise, the guard ring becomes less effective and thermal distortion problems still are present in the peripheral edge portion of the semiconductor ingot.

For thin semiconductor wafers, the requirement that the separation width between the guard ring and the wafer be less than the wafer thickness and the requirement that the guard ring and the semiconductor wafer to be co-planar make the use of guard rings commercially unfeasible for a number of reasons. First, the wafer must be positioned in the guard ring without touching the guard ring. For small separations, this becomes exceedingly difficult and time consuming for mass production operations. Furthermore, the diameter of the wafers tend to vary from one lot to another requiring the costly manufacture of semiconductor guard rings for each new wafer lot. In addition, for thin wafers it is also difficult to align reproducibly the planes of the guard ring and the wafer. Without such parallel alignment, the guard ring method will not work effectively or may even be a complete failure.

In summary, then, the prior art methods of thermal gradient zone melting processing of thin semiconductor wafers either makes impossible the production of certain types of devices or wastes about twenty percent of a processed semiconductor wafer which must be discarded because of thermal gradient distortion problems around the peripheral edge portion of the wafer.

In our co-pending patent application, "Process for Thermal Gradient Zone Melting Utilizing a Beveled Wafer and a Bevel Guard Ring," Ser. No. 967,283, we disclose a method for using the guard ring concept for thin semiconductor wafers. This method of processing requires a separate annular guard ring with a beveled inner edge and preferably a wafer with a beveled edge. The bevel angles of the outer peripheral edge of the wafer and the inner edge of the annular guard ring are selected so as to be mathematical supplements (their sum is 180 degrees) of each other. The annular beveled guard ring acts thermally like an extension of the semiconductor wafer and, consequently, distortions in the thermal gradient that would have occurred around the peripheral edge of the semiconductor wafer in the absence of the annular guard ring are translated to the guard ring leaving the semiconductor wafer substantially free from distortions in the thermal gradient.

Although this latter method is commercially feasible, it requires the manufacture of annular guard rings and some care in placement of the semiconductor wafers in the annular guard rings rather than in some random arrangement beneath the radiation source during temperature gradient zone melting processing. The guard ring method of substantially eliminating thermal gradient distortions in the semiconductor wafer rests on the idea of translating this problem from the wafer to the guard ring. Another basis for solving the distortion in the thermal gradient at the wafer edge, is to eliminate the source of this problem; namely, the net loss of heat by radiation from the edge of the wafer.

It is, therefore, an object of this invention to provide a new and improved wafer, or body, of semiconductor material for processing by thermal gradient zone melting.

Another object of this invention is to provide a new and improved wafer, or body, of semiconductor material for minimizing thermal gradient edge distortions in the wafer, or body, during the practice of thermal gradient zone melting.

Another object of this invention is to provide a new and improved wafer, or body, of semiconductor material for minimizing thermal gradient edge distortions in a thin wafer, or body, during the practice of thermal gradient zone melting which does not add a large number of additional wafer processing steps and therefore increase commercial production costs.

Another object of this invention is to provide a new and improved wafer, or body, of semiconductor material for minimizing thermal gradient edge distortions in the wafer, or body, during the practice of thermal gradient zone melting which does not require other objects such as heat shields or guard rings for its successful utilization.

BRIEF DESCRIPTION OF THE INVENTION

In accordance with the teachings of this invention there is provided a body of semiconductor material suitable for processing by thermal gradient zone melting. The body has a first type conductivity, a selected level of resistivity, another side peripheral surface and two major opposed substantially parallel surfaces which are, respectively, the top and bottom surfaces thereof. At least one of the major surfaces has a preferred planar crystal orientation which is one selected from the group consisting of (100), (110) and (111), and a vertical axis of the body being substantially aligned at a predetermined angle with a first axis of the crystal structure. The included angle α is equal to approximately 41° and preferably is 41° ±3°.

DESCRIPTION OF THE INVENTION

Figure 2:
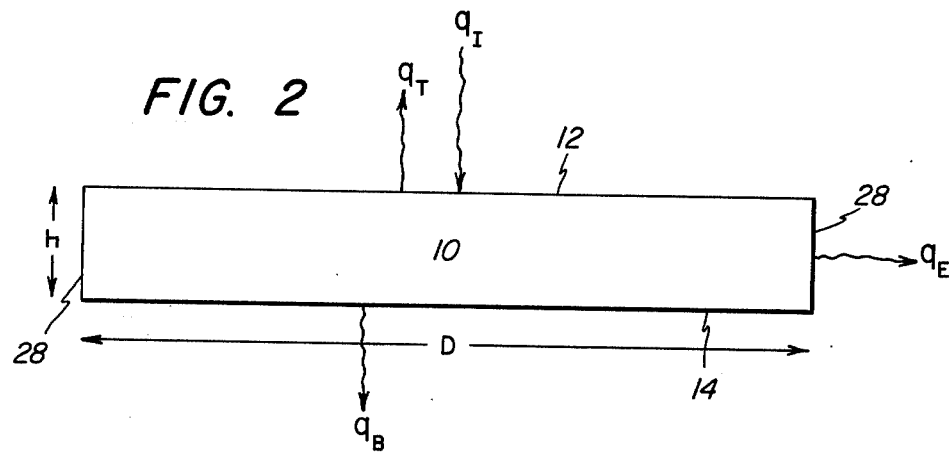
FIG. 2 is a schematic diagram of the radiation heat balance for a semiconductor being processed by thermal gradient zone melting.

Referring now to FIG. 2, there is shown a semiconductor wafer or body 10 having opposed major surfaces 12 and 14 which are, respectively, the top and bottom surfaces thereof and having an outer side peripheral surface 28. The semiconductor body has a particular level of resistivity, a first type conductivity, and may be silicon, germanium, silicon carbide, gallium arsenide, a compound of a Group II element and a Group VI element and a compound of a Group III element and a Group V element.

The thermal migration of metal wires is preferably practiced in accordance with the planar orientations, thermal migration directions, stable wire directions and stable wire sizes of the following Table.

| Wafer Plane | Migration Direction | Stable Wire Directions | | Stable Wire Sizes |
|---|---|---|---|---|
| (100) | <100> | <01$\bar{1}$>* | | <100 microns |
| | | <0$\bar{1}\bar{1}$>* | | <100 microns |
| (100) | <100> | <1$\bar{1}$0>* | | <150 microns |
| (111) | <111> | (a) <01$\bar{1}$>* | | |
| | | <$\bar{1}$01> | | <500 microns |
| | | <1$\bar{1}$0> | | |
| | | (b) <11$\bar{2}$>* | | |
| | | <$\bar{2}$11>* | | <500 microns |
| | | <1$\bar{2}$1>* | | |
| | | (c) Any other* direction in (111) plane. | | <500 microns |

*The stability of migrating wire is sensitive to the alignment of the thermal gradient with the <100>, <110> and <111> axis, respectively.
*Group a is more stable than group b which is more stable than group c.

Droplets are migrated in the Migration Direction. The shape of the droplet is determined by the wafer plane orientation and migration direction. In a crystal axis direction of <111> of thermal migration, the droplet migrates as a triangular platelet laying in a (111) plane. A droplet migrates in the <100> crystal axis direction as a regular pyramid bounded by four forward (111) planes and a rear (100) plane. A droplet migrates in the <110> crystal axis direction as an irregular pyramid with a diamond base.

The Migration Direction may coincide, that is be aligned, with the vertical axis of the body or it may be from 2° to 15° off the crystal axis.

The temperature gradient zone melting process and apparatus is not a part of this invention. For a more thorough understanding of the temperature gradient zone melting process employed in this invnetion and for a more thorough description of the apparatus employed for this process, one is directed to the following U.S. patents entitled: Method of Making Deep Diodes U.S. Pat. No. 3,901,736; Deep Diode Device and Method, U.S. Pat. No. 3,902,925; Deep Diode Devices and Method and Apparatus, U.S. Pat. No. 4,091,257; High Velocity Thermomigration Method of Making Deep Diodes, U.S. Pat. No. 3,898,106; Deep Diode Device and Method, U.S. Pat. No. 3,902,925; Stabilized Droplet Method of Making Deep Diodes Having Uniform Electrical Properties, U.S. Pat. No. 3,899,361; Method of Making Isolation Grids in Bodies of Semiconductor Material, U.S. Pat. No. 3,979,230; and Thermomigration of Metal-Rich Liquid Wires Through Semiconductor Materials, U.S. Pat. No. 3,899,962.

The surface of the body of semiconductor material is prepared by usual semiconductor processing techniques for deposition of the metal to be migrated through the solid body of material. The metal may be deposited by any suitable means on the surface of initiation of melt migration. For example, when the body is of N-type silicon semiconductor material and the melt to be migrated comprises, at least in part, aluminum, it has been discovered that the vapor deposition of the layer of aluminum metal should be performed at a pressure of approximately $1 \times 10^{-5}$ torr but not greater than $5 \times 10^{-5}$ torr. When the pressure is greater than $5 \times 10^{-5}$ torr, we have found that in the case of aluminum metal vapor deposited, the aluminum does not easily penetrate into the silicon and migrate through the body. It is believed that the layer of aluminum is saturated with oxygen and prevents reduction by the aluminum metal of the very thin silicon oxide layer between the deposited aluminum and the silicon. Thus, the initial melt of aluminum and silicon required for migration is not obtained because of the inability of the aluminum layer to wet and alloy with the underlaying silicon. In a similar manner, the aluminum deposited by sputtering is not as desirable as sputtered aluminum appears to be saturated with oxygen from the sputtering process, thereby preventing the reduction of any intervening silicon oxide. The preferred methods of depositing aluminum on the silicon body are by the electron beam method and the like wherein little, if any, oxygen can be trapped in the aluminum.

Figure 1:
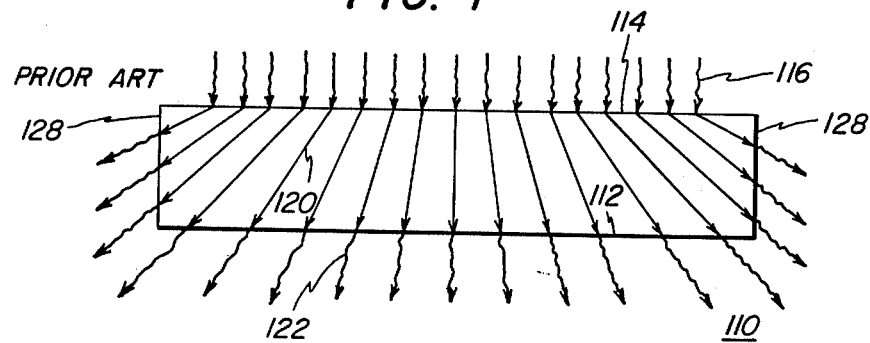
FIG. 1 is a side elevation view, in cross section, of the heat flow lines in a body of semiconductor material processed by prior art TGZM methods.

The peripheral side edge 28 of a semiconductor wafer 10 undergoing temperature gradient zone melting processing represents a thermal discontinuity in the otherwise planar body 10. If there is no net heat gain or loss from the peripheral side edge 28 of the semiconductor wafer 10, then by St. Venant's principle, any thermal distortions as shown in FIG. 1 will extend in only one wafer thickness, h, from the peripheral side 28 of the semiconductor wafer 10.

Unfortunately, in general, there is a net heat loss $q_E$ from the peripheral side edge 28 of the semiconductor wafer 10 that can cause substantial cooling of the wafer side edge 28. The resulting radial thermal gradient associated with the net heat loss $q_E$ from the side peripheral edge 28 of the wafer 10 causes a distortion in the thermal gradient that extends many wafer thicknesses, h, in from the side edge 28 of the wafer 10 and can cause disregistry and distorsions in the recrystallized zones generated by temperature gradient zone melting processing.

Referring now to FIG. 2, a semiconductor wafer 10 undergoing temperature gradient zone melting by radiational heating is shown. The diameter of the semiconductor wafer 10, D, is much greater than its thickness, h. The wafer 10 absorbs $q_I$ units of radiation per unit area on its top surface 12. The hot wafer 10, in turn, radiates $q_T$ units of radiation per unit area from its top surface 12, $q_B$ units of radiation per unit area from its bottom surface 14 and $q_E$ units of radiation per unit area from its edge 28. If D>>h, the edge effects can be ignored and conservation of heat requires $$q_I = q_T + q_B, \quad D >> h \tag{1}$$

However, since $q_T \, \alpha T_T^4$ and $q_B \, \alpha T_B^4$ and $q_E \, \alpha T_E^4$, where $T_T$, $T_B$ and $T_E$ are respectively the temperatures of the top face 12, bottom face 14 and edge 28 of the wafer 10, and because $T_T \simeq T_B \simeq T_E$ since the maximum temperature difference through a semiconductor wafer 10 of 0.1 cm thickness undergoing thermal migration in a typical 50° C./cm temperature gradient is only about ½° C., then $$q_B \simeq q_T \simeq q_E \tag{2}$$

where it is again stressed that q is the radiation per unit area.

The combination of equations (1) and (2) yield the relation $$q_E = \tfrac{1}{2} q_I \tag{3}$$

which will be useful later.

Figure 3:
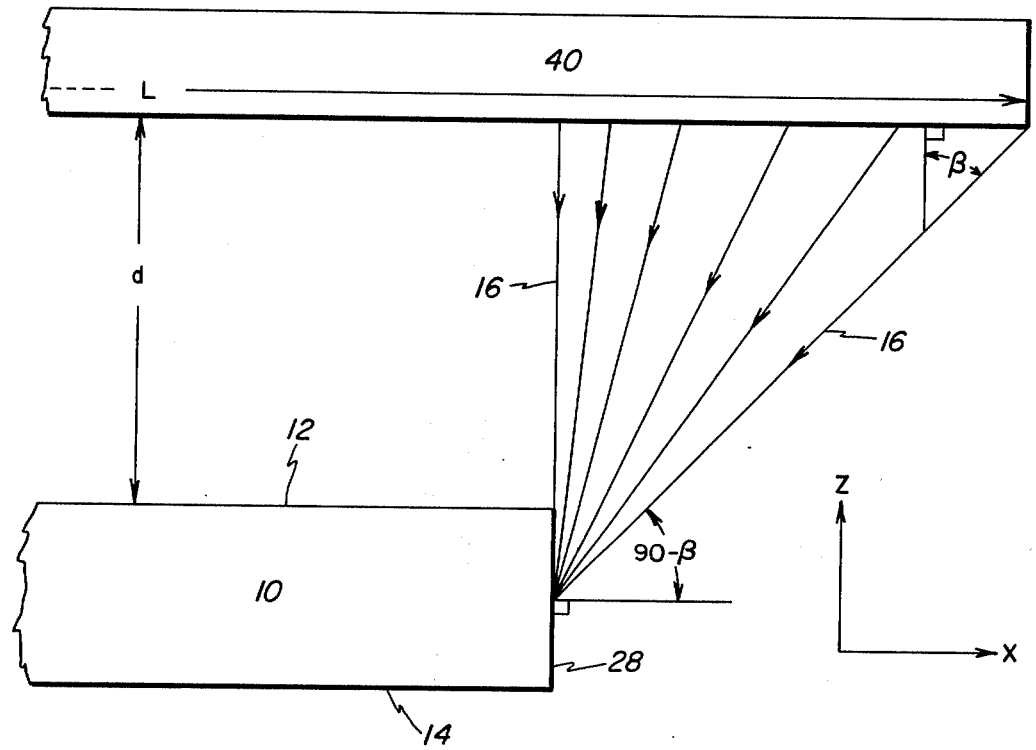
FIG. 3 is an elevation view, in cross section, of the outer peripheral edge of a semiconductor wafer beneath a finite radiant heat source.

Referring now to FIG. 3, a wafer edge 28 is shown centrally below and spaced a predetermined distance d from a finite-size radiant heat source 40 of length L which is typically an array of high temperature quartz tungsten lamps. Heat rays 16 from the radiant source strike and are absorbed over the angular range indicated.

At the edge 28 of the wafer 10 both emission and absorption area taking place. To find the net heat loss from the edges 28 of the wafer 10, the solid angles of absorption $\Omega_{ABS}$ from the radiant heat source and emission $\Omega_{EM}$ must be considered as well as the sighting factors of $\cos\theta$ from Lamberts law of diffuse radiation. If the variations of emissivity and absorptivity with angle are ignored, the radiation $q_{ABS}$ absorbed per unit area of the edge 28 is found to be $$q_{ABS} = q_I \frac{(1 - \cos\beta)}{2} \tag{4}$$

where $\beta$ is the limiting angle set by the finite size of the radiant heat source.

Similarly, the radiation $q_{EM}$ emitted per unit area of the edge 28 is $$q_{EM} = q_E \tag{5}$$

Substitution of equation (3) into equation (4) and subtraction of equation (4) from equation (5) yields the net heat loss $\Delta Q$ from the edge 28 is $$\Delta q = Q_E \cos\beta \tag{6}$$

This net heat loss $\Delta Q$ below a finite size radiant heat source 40 causes a distortion in the thermal gradient that extends many wafer thicknesses h into the body 10 of the semiconductor material. With an infinite size radiation heat source 40, the angle $\alpha$ would be ninety degrees and the net heat loss $\Delta Q$ from equation 4 would be zero, thereby limiting the area of distortion in thermal gradient to within one wafer thickness h of the side peripheral edge 28 of body 10 by St. Venant's principle. Since semiconductor wafers are typically from six to eighteen mils thick, only six to eighteen mils in from the edge 28 of the wafer 10 would be lost because of distortions in the thermal gradient during temperature gradient zone melting. Because this restricted area is not used in commercial production because of edge chipping and photolithography problems near the wafer edge, no practical loss of semiconductor material results. Consequently, the use of an infinite radiant heat source 40 or a source 40 approaching such dimensions relative to the wafer size D would eliminate distortions in the thermal gradient in the semiconductor wafer 10.

Figure 4:
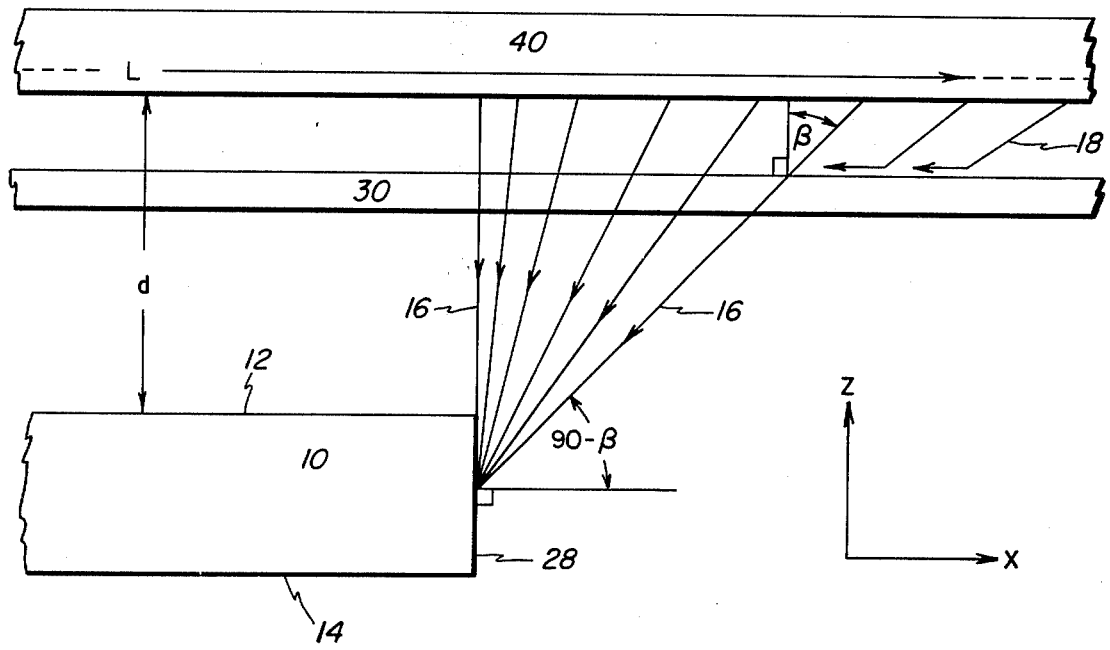
FIG. 4 is an elevation view, in cross section, of the outer peripheral edge of a semiconductor wafer beneath an infinite planar radiant heat source with a quartz protective plate interposed between the heat source and the wafer.

In most actual temperature gradient zone melting machines (see, for example, "Temperature Gradient Zone Melting Utilizing Infrared Radiation," U.S. Pat. No. 4,001,047) a quartz plate is interposed between the radiant heat source 40 and the semiconductor body 10 in order to prevent contamination of the body 10. Referring now to FIG. 4, the interposition of a quartz plate 30 between the semiconductor body 10 and the radiant heat source 40 effectively converts even an infinite size heat source into a finite heat source as seen by the wafer because of the total reflection of radiant heat rays 18 above a critical angle of reflection $\beta$ by the interposed quartz plate 30. Total internal reflection occurs at an angle of 41 degrees. Radiant heat rays 16 impinging on the transparent sheet 30 at an angle less than the critical incidence angle $\beta$ are transmitted through the sheet 30. In contrast, radiant heat rays 18 that are incident on the transparent sheet 30 at angles greater than the critical incident angle $\beta$ are totally reflected. Hence, the semiconductor wafer 10 effectively sees a finite-size radiant source 40 which in turn leads to a distortion in the thermal gradient that extends many wafer thickness into the wafer from the side peripheral edge 28 of the wafer because of the net heat loss from the edge 28 given by equation 6 where $\beta$ is the critical angle of total internal reflection.

Figure 5:
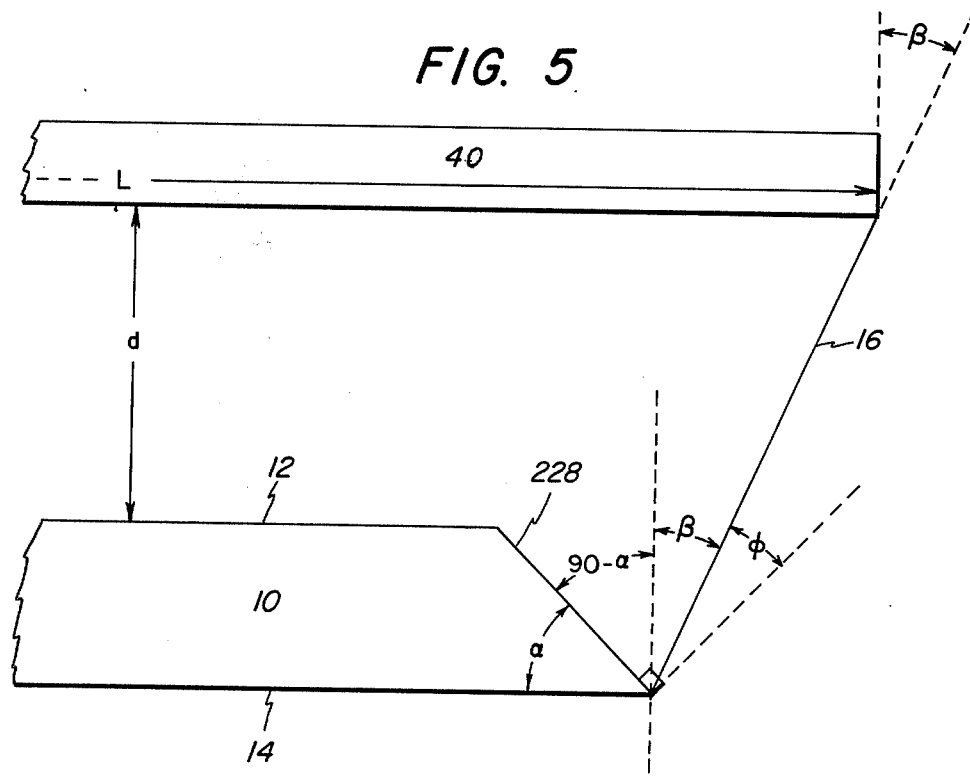
FIG. 5 is a side elevation view, in cross section, of a semiconductor wafer with an outer beveled peripheral edge, below a radiant heat source of finite size.

Referring now to FIG. 5, we have discovered a simple means of achieving a zero net heat loss or gain from the wafer edge by beveling the outer peripheral side edge 228 of the semiconductor wafer 10. The angle $\alpha$ is calculated from the radiation intensity $q_I$ impinging on the top surface 12 of body 10 from the radiant heat source 40, the radiation intensity $q_E$ emitted by the side peripheral edge of the wafer and the limiting radiant ray angle $\beta$ resulting from either the finite size of the radiant heat source or the total internal reflection that occurs at an angle $\beta$ in an interposed transparent sheet.

To calculate the bevel angle $\alpha$ that leads to no net heat gain or loss from the side peripheral edge 228 of the semiconductor wafer 10, the heat $H_{in}$ absorbed by the edge 228 of the wafer must be set equal to the heat $H_{out}$ emitted by the edge 228 of the wafer.

The heat $H_{in}$ absorbed by the wafer is, $$H_{in} = q_I \int_{\alpha - \beta}^{\pi/2} \cos\theta \, d\theta \tag{7}$$

$$H_{in} = q_r[1 - \sin(\alpha - \beta)]$$

The radiation $H_{out}$ emitted by the edge 228 is $$H_{out} = q_x \int_{-\pi/2}^{+\pi/2} \cos\theta \, d\theta \tag{8}$$

$$H_{out} = 2q_x$$

Setting $H_{out} = H_{in}$, $$2q_x = q_r[1 - \sin(\alpha - \beta)] \tag{9}$$

$$\alpha = \beta + \sin^{-1}\left[1 - \frac{2q_x}{q_r}\right] \tag{10}$$

A combination of equations (3), (9) and (10) gives the angle $\alpha$ equals the angle $\beta$.

$$\alpha = \beta \tag{11}$$

For a finite size radiant heat source 40, the angle $\beta$ is determined from the geometry shown in FIG. 3 and FIG. 5. For commercial applications one may assume angle $\beta$ to approximately equal $\tan^{-1}(2d/L)$. For a transparent protective sheet 30 interposed between the radiant heat source 40 and the semiconductor wafer 10, the angle $\beta$ is equal to the angle of total internal reflection for the material comprising the sheet 30. In the case of quartz as the material comprising the sheet 30, $\beta$ equals 41 degrees. In commercial production, the planarity of the quartz plate is usually only good to within ±3 degrees because of manufacturing defects and the elastic sag of the quartz plate between its supports. Consequently, the bevel angle $\alpha$ of the wafer need not equal the theoretical angle of 41 degrees exactly but may range ±3 degrees about this angle. In the same manner, it is difficult to bevel wafers accurately as a mass production basis to an accuracy of more than ±2 degrees. The beveled surface 228 should be smooth to within the wavelength of the radiation impinging on the surface of wafer 10.

Beveling the side peripheral edge of the wafer has the following advantage in the commercial production of power devices: it requires no equipment modification; it allows the use of standard size wafers; it can be used with different size wafers; and the beveling can be easily carried out on standard commercial equipment now used to bevel certain types of power devices to increase their blocking voltage.

We claim as our invention:

1. A body of semiconductor material suitable for processing by thermal gradient zone melting comprising:

a body of semiconductor material having a first type conductivity, a selected level of resistivity, an outer side peripheral surface, two major opposed substantially parallel surfaces which are, respectively, the top and bottom surfaces thereof, and at least one major surface has a preferred planar crystal structure orientation which is one selected from the group consisting of (100), (110) and (111), and a vertical axis of the body being substantially aligned at a predetermined angle with a first axis of the crystal structure; and the outer side peripheral surface is beveled to form an included angle $\alpha$ with the bottom surface equal to approximately 41°.

2. The body of semiconductor material of claim 1 wherein the measure of angle $\alpha$ is 41° ±3°.

3. The body of semiconductor material of either claim 1 or 2 wherein the semiconductor material is silicon, germanium, gallium arsenide and silicon carbide.

* * * * *